US012660482B2

(12) United States Patent
Kim et al.

(10) Patent No.: US 12,660,482 B2
(45) Date of Patent: Jun. 16, 2026

(54) DISPLAY DEVICE

(71) Applicant: LG DISPLAY CO., LTD., Seoul (KR)

(72) Inventors: YongCheol Kim, Paju-si (KR);
EunYoung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 455 days.

(21) Appl. No.: 18/371,148

(22) Filed: Sep. 21, 2023

(65) Prior Publication Data

US 2024/0172537 A1 May 23, 2024

(30) Foreign Application Priority Data

Nov. 23, 2022 (KR) ........................ 10-2022-0158098

(51) Int. Cl.
*H10K 59/122* (2023.01)
*H10K 59/80* (2023.01)

(52) U.S. Cl.
CPC ......... *H10K 59/879* (2023.02); *H10K 59/122* (2023.02); *H10K 59/873* (2023.02)

(58) Field of Classification Search
None
See application file for complete search history.

(56) References Cited

U.S. PATENT DOCUMENTS

| | | |
|---|---|---|
| 8,963,138 B2 | 2/2015 | Lim et al. |
| 10,790,474 B2 | 9/2020 | Lee et al. |

| | | |
|---|---|---|
| 2013/0002690 A1 | 1/2013 | Ichinose et al. |
| 2017/0092705 A1 | 3/2017 | Lim et al. |
| 2018/0351133 A1 | 12/2018 | Yoo et al. |
| 2020/0373520 A1 | 11/2020 | Kim et al. |

FOREIGN PATENT DOCUMENTS

| | | | | |
|---|---|---|---|---|
| JP | 2013-016273 A | 1/2013 | | |
| KR | 10-2014-0014685 A | 2/2014 | | |
| KR | 10-2017-0038633 A | 4/2017 | | |
| KR | 20170038633 A | * 4/2017 | ....... | H01L 21/02065 |
| KR | 10-2018-0131714 A | 12/2018 | | |
| KR | 10-2020-0028257 A | 3/2020 | | |
| KR | 10-2020-0135068 A | 12/2020 | | |

OTHER PUBLICATIONS

English Machine Translation of Lim et al, KR29170038633 (Year: 2026).*
Notice of Allowance issued on Jan. 7, 2026 for Korean Patent Application No. 10-2022-0158098.

* cited by examiner

*Primary Examiner* — Donald L Raleigh
(74) *Attorney, Agent, or Firm* — Morgan, Lewis & Bockius LLP

(57) ABSTRACT

Embodiments of the present disclosure relate to a display device. More particularly, the embodiments of the present disclosure may provide a display device including an insulating film including a first concave portion, a first partition wall which is positioned in the first concave portion and divides the first concave portion, and a first lens portion corresponding to divided areas of the first concave portion, thereby effectively improving light emitting efficiency.

14 Claims, 16 Drawing Sheets

DISPLAY DEVICE

CROSS-REFERENCE TO RELATED APPLICATION

This application claims priority from Korean Patent Application No. 10-2022-0158098, filed on Nov. 23, 2022, which is hereby incorporated by reference for all purposes as if fully set forth herein.

BACKGROUND

Technical Field

Embodiments of the present disclosure relate to a display device.

Discussion of the Related Art

A display device which realizes various information on a screen is a key technology in the era of information and communication technology, and serves to display various information in a display area.

In the display device, excellent display quality and luminous efficiency may be required. In particular, the importance of luminous efficiency is increasing because the display device is required to use limited power according to the development of technology.

The light emitting efficiency of the display device may be determined by light emitting elements included in the display device. The display device including light emitting elements having excellent light emitting efficiency may have excellent light emitting efficiency. Therefore, as a method for improving the light emitting efficiency of the display device, it may be considered to improve the light emitting efficiency of the light emitting elements. However, difficulties exist in improving the light emitting efficiency of the light emitting elements.

In this situation, research is being conducted on a method capable of improving the light emitting efficiency of the display device while using the same light emitting elements as in the prior art. However, this method has a problem such as further complicating the manufacturing process of the display device.

In order to improve the light emitting efficiency of the display device, a lens portion for improving light emitting efficiency may be disposed over a light emitting element. However, there is a problem in that the improvement of light emitting efficiency according to the introduction of the lens portion is not sufficient or the degree of light emitting efficiency improvement effect is different in subpixels having different colors. In this situation, the inventors of the present specification have invented a display device capable of effectively improving light emitting efficiency, by including an insulating film including a concave portion, a partition wall positioned in the concave portion and dividing the concave portion and lens portions corresponding to divided areas of the concave portion.

SUMMARY

Accordingly, embodiments of the present disclosure are directed to a display device that substantially obviates one or more of the problems due to limitations and disadvantages of the related art.

An aspect of the present disclosure is to provide a display device capable of effectively improving light emitting efficiency, by including an insulating film including a concave portion, a partition wall positioned in the concave portion and dividing the concave portion and lens portions corresponding to divided areas of the concave portion.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate, an insulating film, a first partition wall, a first electrode, an encapsulation layer and a first lens portion.

The substrate may include a first subpixel.

The insulating film may be positioned on the substrate. The insulating film may include a first concave portion and a first sloped portion. The first concave portion may be positioned in the first subpixel. The first sloped portion may be positioned while surrounding the first concave portion.

The first partition wall may be positioned in the first concave portion. The first partition wall may divide the first concave portion.

The first electrode may be positioned on the insulating film and the first partition wall.

The encapsulation layer may be positioned on the first electrode.

The first lens portion may be positioned on the encapsulation layer. The first lens portion may be positioned in correspondence to areas of the first concave portion which are divided by the first partition wall.

According to the embodiments of the present disclosure, it is possible to provide a display device capable of effectively improving light emitting efficiency, by including an insulating film including a first concave portion, a first partition wall positioned in the first concave portion and dividing the first concave portion and first lens portions corresponding to divided areas of the first concave portion.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
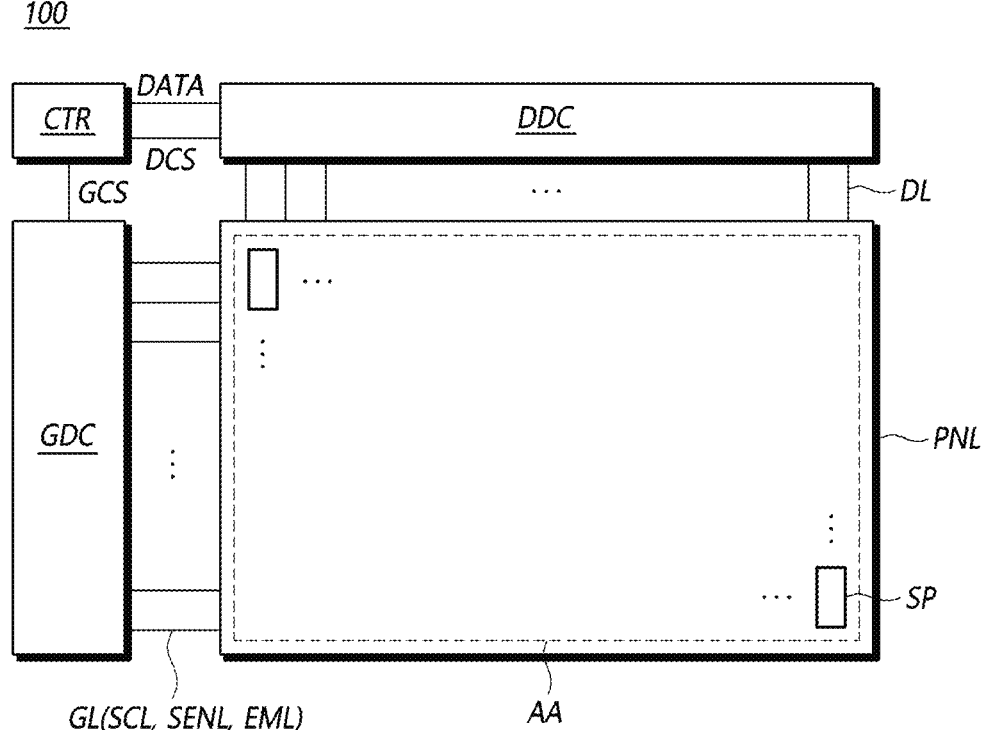
FIG. 1 is a system configuration diagram of a display device in accordance with embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

FIG. 1 is a system configuration diagram of an organic light emitting display device 100 in accordance with embodiments of the present disclosure.

Referring to FIG. 1, the organic light emitting display device 100 in accordance with the embodiments of the present disclosure may include a display panel PNL in which a plurality of data lines DL and a plurality of gate lines GL are disposed and a plurality of subpixels SP connected to the plurality of data lines DL and the plurality of gate lines GL are arranged in an active area AA, and a driving circuit for driving the display panel PNL.

From a functional point of view, the driving circuit may include a data driving circuit DDC which drives the plurality of data lines DL, a gate driving circuit GDC which drives the plurality of gate lines GL, and a controller CTR which controls the data driving circuit DDC and the gate driving circuit GDC.

In the display panel PNL, the plurality of data lines DL and the plurality of gate lines GL may be disposed to intersect with each other. For example, the plurality of data lines DL may be disposed in columns or rows, and the plurality of gate lines GL may be disposed in rows or columns. Hereinbelow, for the sake of convenience in explanation, it is assumed that the plurality of data lines DL are disposed in columns and the plurality of gate lines GL are arranged in rows.

The controller CTR supplies various control signals DCS and GCS necessary for driving operations of the data driving circuit DDC and the gate driving circuit GDC, thereby controlling the data driving circuit DDC and the gate driving circuit GDC.

The controller CTR starts scan according to a timing implemented in each frame, converts input image data inputted from the outside to be suitable for a data signal format used in the data driving circuit DDC, outputs converted image data DATA, and controls data driving at an appropriate time in correspondence to the scan.

The controller CTR may be a timing controller which is used in a typical display technology or a control device which includes a timing controller and is capable of further performing other control functions.

The controller CTR may be implemented as a component separate from the data driving circuit DDC, or may be implemented as an integrated circuit by being incorporated with the data driving circuit DDC.

The data driving circuit DDC receives the image data DATA from the controller CTR and supplies data voltages to the plurality of data lines DL, thereby driving the plurality of data lines DL. The data driving circuit DDC is also referred to as a source driving circuit.

The data driving circuit DDC may be implemented by including at least one source-driver integrated circuit (S-DIC). Each source-driver integrated circuit (S-DIC) may include a shift register, a latch circuit, a digital-to-analog converter (DAC), an output buffer, and so forth. As the case may be, each source-driver integrated circuit (S-DIC) may further include an analog-to-digital converter (ADC).

Each source-driver integrated circuit (S-DIC) may be connected to bonding pads of the display panel PNL in a tape automated bonding (TAB) method or a chip-on-glass (COG) method, or may be directly disposed in the display panel PNL. As the case may be, each source-driver integrated circuit (S-DIC) may be disposed in the display panel PNL by being integrated thereinto. Alternatively, each source-driver integrated circuit (S-DIC) may be implemented in a chip-on-film (COF) method in which the source-driver integrated circuit (S-DIC) is mounted on a source-circuit film connected to the display panel PNL.

The gate driving circuit GDC sequentially supplies scan signals to the plurality of gate lines GL, thereby sequentially driving the plurality of gate lines GL. The gate driving circuit GDC is also referred to as a scan driving circuit.

The gate driving circuit (GDC) may be connected to bonding pads of the display panel PNL in a tape automated bonding (TAB) method or a chip-on-glass (COG) method, or may be directly disposed in the display panel PNL by being implemented in a gate-in-panel (GIP) type. As the case may be, the gate driving circuit GDC may be disposed in the display panel PNL by being integrated thereinto. Alternatively, the gate driving circuit (GDC) may be implemented by a plurality of gate driver integrated circuits (G-DIC) to be implemented in a chip-on-film (COF) method in which the gate driving circuit (GDC) is mounted on a gate-circuit film connected to the display panel PNL.

The gate driving circuit GDC sequentially supplies scan signals of an on voltage or an off voltage to the plurality of gate lines GL under the control of the controller CTR.

When a specific gate line GL is open by the gate driving circuit GDC, the data driving circuit DDC converts the image data DATA received from the controller CTR into analog type data voltages, and supplies the data voltages to the plurality of data lines DL.

The data driving circuit DDC may be positioned on only one side (e.g., the top side or the bottom side) of the display panel PNL. As the case may be, the data driving circuit DDC may be positioned on both sides (e.g., the top side and bottom side) of the display panel PNL depending on a driving method, a panel design method, etc.

The gate driving circuit GDC may be positioned on only one side (e.g., the left side or the right side) of the display panel PNL. As the case may be, the gate driving circuit GDC may be positioned on both sides (e.g., the left side and right side) of the display panel PNL depending on a driving method, a panel design method, etc.

The plurality of gate lines GL disposed in the display panel PNL may include a plurality of scan lines SCL, a plurality of sense lines SENL and a plurality of emission control lines EML. The scan lines SCL, the sense lines SENL and the emission control lines EML are lines which transfer different types of gate signals (scan signals, sense signals and emission control signals) to gate nodes of different types of transistors (scan transistors, sense transistors and emission control transistors).

Figure 2:
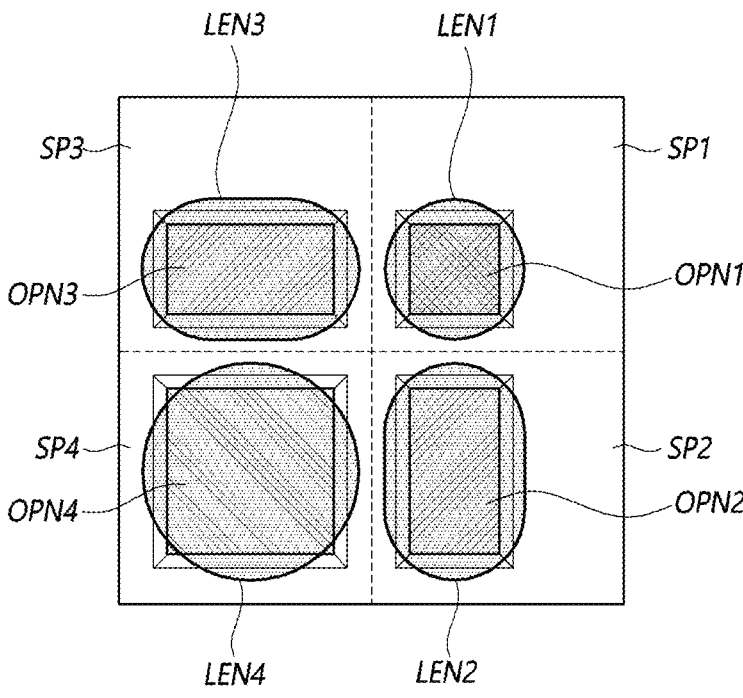
FIG. 2 is a plan view of a display device according to a comparative example of the present disclosure.

FIG. 2 is a plan view of a display device according to a comparative example of the present disclosure. In more detail, FIG. 2 is a plan view of a part of an active area of the display device according to the comparative example of the present disclosure.

Referring to FIG. 2, the display device according to the comparative example may include a plurality of subpixels. The plurality of respective subpixels may be referred to as a first subpixel SP1, a second subpixel SP2, a third subpixel SP3 and a fourth subpixel SP4.

The respective subpixels SP1, SP2, SP3 and SP4 may include openings OPN1, OPN2, OPN3 and OPN4. The openings OPN1, OPN2, OPN3 and OPN4 may be referred to as a first opening OPN1, a second opening OPN2, a third opening OPN3 and a fourth opening OPN4, respectively.

Emission areas of the subpixels SP1, SP2, SP3 and SP4 may be defined by the openings OPN1, OPN2, OPN3 and OPN4. The emission areas of the subpixels SP1, SP2, SP3 and SP4 may be substantially the same as the openings OPN1, OPN2, OPN3 and OPN4. Being substantially the same in the present disclosure may mean the same degree in consideration of a minute difference due to an error in a process.

The respective subpixels SP1, SP2, SP3 and SP4 may include lens portions LEN1, LEN2, LEN3 and LEN4 corresponding to the openings OPN1, OPN2, OPN3 and OPN4. The lens portions LEN1, LEN2, LEN3 and LEN4 are to improve light emitting efficiency by changing the optical paths of light emitted through the openings OPN1, OPN2, OPN3 and OPN4. The lens portions LEN1, LEN2, LEN3 and LEN4 may be positioned to correspond to the openings OPN1, OPN2, OPN3 and OPN4, and their shapes may also correspond to the shapes of the openings OPN1, OPN2, OPN3 and OPN4.

Some of the subpixels SP1, SP2, SP3 and SP4 may emit light of different colors. For example, the first subpixel SP1 may emit red light, the second subpixel SP2 and the third subpixel SP3 may emit green light, and the fourth subpixel SP4 may emit blue light.

Subpixels which emit light of different colors may include openings which have different areas. For example, the area of the fourth opening OPN4 of the fourth subpixel SP4 which emits blue light may be largest, and the area of the first opening OPN1 of the first subpixel SP1 which emits red light may be smallest. This may be because the element characteristics of light emitting elements included in subpixels which emit light of different colors are different from each other.

Although the subpixels SP1, SP2, SP3 and SP4 include light emitting elements which have different element characteristics, difficulties exist in forming a lens portion optimized for the characteristics of each light emitting element, when considering the process of the display device. When a lens portion is formed in consideration of difficulties in process, there is a limit in improving light emitting efficiency.

Figure 3:
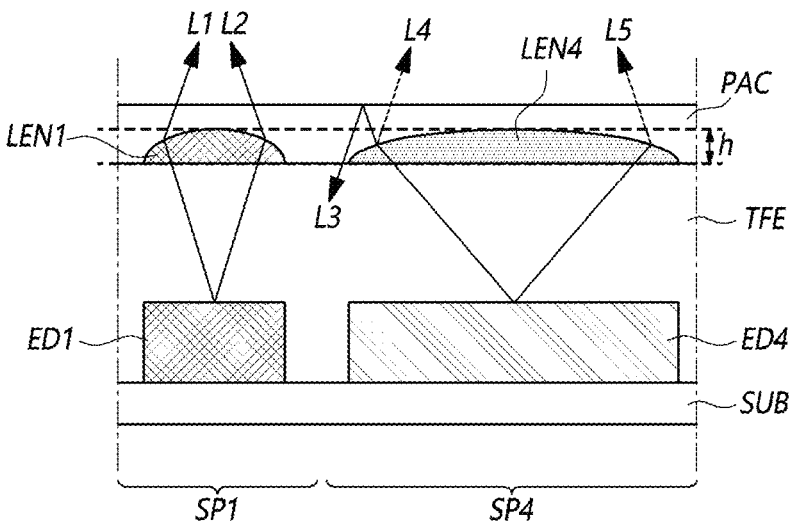
FIGS. 3 and 4 are cross-sectional views of the display device according to the comparative example of the present disclosure.

FIG. 3 is a cross-sectional view of the display device according to the comparative example of the present disclosure. In more detail, FIG. 3 is a schematic cross-sectional view of a part where the first subpixel SP1 and the fourth subpixel SP4 are positioned in the display device illustrated in FIG. 2.

Referring to FIG. 3, the display device may include a substrate SUB which includes the subpixels SP1 and SP4, light emitting elements ED1 and ED4 which are positioned on the substrate SUB, an encapsulation layer TFE which is positioned on the light emitting elements ED1 and ED4, lens portions LEN1 and LEN4 which are positioned on the encapsulation layer TFE, and a planarization layer PAC which is positioned on the lens portions LEN1 and LEN4.

The lens portions LEN1 and LEN4 may include a high refractive index material, and the planarization layer PAC may include a low refractive index material. When the lens portions LEN1 and LEN4 include a high refractive index material to have a refractive index higher than the planarization layer PAC and the planarization layer PAC includes a low refractive index material to have a refractive index lower than the lens portions LEN1 and LEN4, the lens portions LEN1 and LEN4 may extract, to the front, the light emitted from the light emitting elements ED1 and ED4, thereby improving light emitting efficiency.

The first subpixel SP1 may include the first light emitting element ED1 which emits light of a red color. The fourth subpixel SP4 may include the fourth light emitting element ED4 which emits light of a blue color.

The lens portions LEN1 and LEN4 may be positioned to correspond to the light emitting elements ED1 and ED4 in order to change the optical paths of the light emitted from the light emitting elements ED1 and ED4.

As illustrated in FIG. 3, the fourth light emitting element ED4 may have a larger area than the first light emitting element ED1. Accordingly, the fourth lens portion LEN4 may have a larger area than the first lens portion LEN1.

The lens portions LEN1 and LEN4 may be formed by the same process to improve efficiency in the process of the display device. For example, the lens portions LEN1 and LEN4 may be formed by the same photolithography process. When the lens portions LEN1 and LEN4 are formed by the same photolithography process, the first lens portion LEN1 and the fourth lens portion LEN4 may have the same height h.

When the lens portions LEN1 and LEN4 corresponding to the light emitting elements ED1 and ED4, respectively, having different areas have the same height h, the lens portions LEN1 and LEN4 may have different aspect ratios. Accordingly, the first lens portion LEN1 and the fourth lens portion LEN4 may have different aspect ratios. When the first lens portion LEN1 and the fourth lens portion LEN4 have different aspect ratios, improvement in light emitting efficiency may be limited, particularly, in a subpixel having a wider area.

Light L1 and L2 emitted from the first light emitting element ED1 may reach the periphery of the first lens portion LEN1. Since the first lens portion LEN1 has a sufficient curvature at the periphery, the light L1 and L2 reaching the periphery of the first lens portion LEN1 may be extracted to the front while passing through the first lens portion LEN1 and the planarization layer PAC.

Light L3, L4 and L5 emitted from the fourth light emitting element ED4 may reach the periphery of the fourth lens portion LEN4. In order for light reaching the periphery of the fourth lens portion LEN4 to be extracted to the front, the light should travel through optical paths like the light L4 and L5. However, since a sufficient curvature is not secured at the periphery of the fourth lens portion LEN4, light actually travels through an optical path like the light L3 and thus is not extracted to the front.

Figure 4:
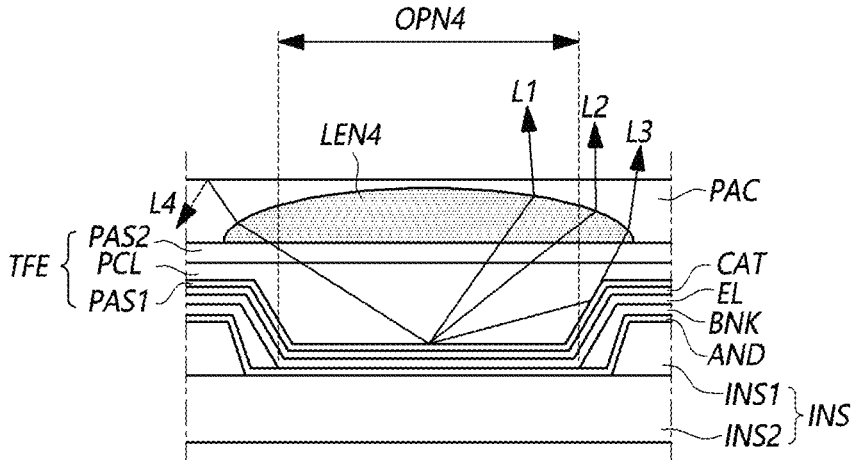

FIG. 4 is a cross-sectional view of the display device according to the comparative example of the present disclosure. In more detail, FIG. 4 is a cross-sectional view of the fourth subpixel SP4 in the display device of FIG. 3.

Referring to FIG. 4, the display device according to the comparative example of the present disclosure may include an insulating film INS, a first electrode AND which is positioned on the insulating film INS, a bank BNK which is positioned on the first electrode AND, a light emitting layer EL which is positioned on the first electrode AND and the bank BNK, a second electrode CAT which is positioned on the light emitting layer EL, the encapsulation layer TFE which is positioned on the second electrode CAT, the lens portion LEN4 which is positioned on the encapsulation layer TFE, and the planarization layer PAC which is positioned on the lens portion LEN4.

The insulating film INS may be a multilayer. For example, the insulating film INS may include a first insulating film INS1 and a second insulating film INS2.

The encapsulation layer TFE may be a multilayer. For example, the encapsulation layer TFE may include a first encapsulation layer PAS1, a second encapsulation layer PCL and a third encapsulation layer PAS2.

The light emitting element ED4 may include the first electrode AND, the light emitting layer EL and the second electrode CAT. The lens portion LEN4 may be positioned in correspondence to the light emitting element ED4. In more detail, the bank BNK may include an opening OPN4, and the lens portion LEN4 may be positioned in correspondence to the opening OPN4.

For some light L1, L2 and L3 among light L1, L2, L3 and L4 emitted from the light emitting element ED4, the lens portion LEN4 may effectively extract light. However, for the light L4, the lens portion LEN4 cannot extract light. This may be because the lens portion LEN4 does not have a sufficient height.

Figure 5:
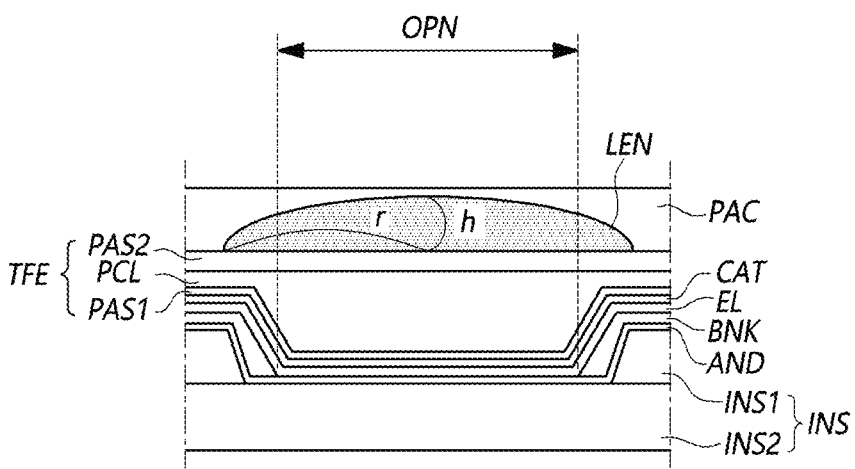
FIG. 5 is a cross-sectional view for explaining an aspect ratio of a lens portion in the present disclosure.

FIG. 5 is a cross-sectional view for explaining an aspect ratio of a lens portion in the present disclosure.

Referring to FIG. 5, a lens portion LEN may be positioned such that the center of the lens portion LEN and the center of an opening OPN are aligned. A radius on the basis of the center of the lens portion LEN may be expressed as r. Also, the height of the lens portion LEN may be expressed as h. The aspect ratio of the lens portion LEN may be expressed as h/r. As the aspect ratio of the lens portion LEN increases, the lens portion LEN may effectively extract, to the front, light emitted from a light emitting element.

When referring to FIG. 3, the first lens portion LEN1 and the fourth lens portion LEN4 have the same height h, but the fourth light emitting element ED4 has a wider area than the first light emitting element ED1. Therefore, the radius of the fourth lens portion LEN4 is larger than the radius of the first lens portion LEN1. Accordingly, since the fourth lens portion LEN4 has a smaller aspect ratio, the fourth lens portion LEN4 may not effectively extract light.

Figure 6:
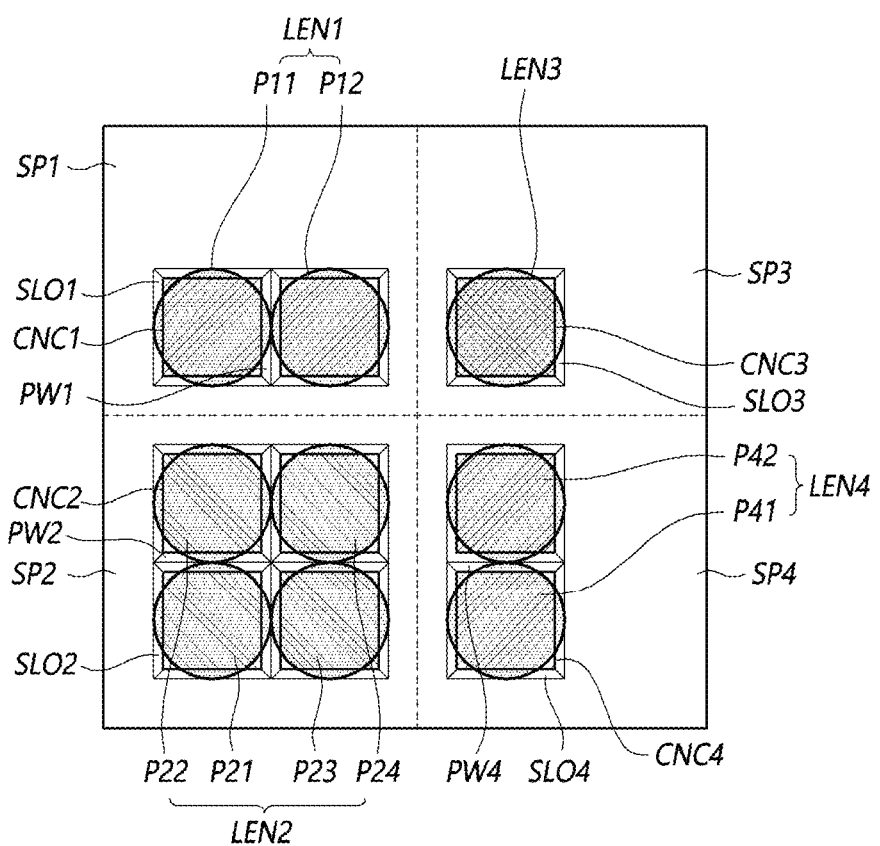
FIG. 6 is a plan view of a display device in accordance with embodiments of the present disclosure.

FIG. 6 is a plan view of a display device in accordance with embodiments of the present disclosure. In more detail, FIG. 6 is a plan view of a part of an active area in the display device in accordance with the embodiments of the present disclosure.

Referring to FIG. 6, the display device in accordance with the embodiments of the present disclosure may include subpixels SP1, SP2, SP3 and SP4. The subpixels SP1, SP2, SP3 and SP4 may be referred to as a first subpixel SP1, a second subpixel SP2, a third subpixel SP3 and a fourth subpixel SP4, respectively.

Concave portions CNC1, CNC2, CNC3 and CNC4 may be positioned in the subpixels SP1, SP2, SP3 and SP4. The concave portions CNC1, CNC2, CNC3 and CNC4 may be referred to as a first concave portion CNC1, a second concave portion CNC2, a third concave portion CNC3 and a fourth concave portion CNC4, respectively. Light emitting elements which emit light may be positioned in the concave portions CNC1, CNC2, CNC3 and CNC4.

Sloped portions SLO1, SLO2, SLO3 and SLO4 which are positioned while surrounding the concave portions CNC1, CNC2, CNC3 and CNC4 may be positioned in the respective subpixels SP1, SP2, SP3 and SP4. The sloped portions SLO1, SLO2, SLO3 and SLO4 may be referred to as a first sloped portion SLO1, a second sloped portion SLO2, a third sloped portion SLO3 and a fourth sloped portion SLO4, respectively.

Partition walls PW1, PW2 and PW4 may be positioned in the concave portions CNC1, CNC2 and CNC4. The partition walls PW1, PW2 and PW4 may be referred to as a first partition wall PW1, a second partition wall PW2 and a fourth partition wall PW4, respectively.

The partition walls PW1, PW2 and PW4 may divide the concave portions CNC1, CNC2 and CNC4. The fact that the partition walls PW1, PW2 and PW4 divide the concave portions CNC1, CNC2 and CNC4 may mean that the partition walls PW1, PW2 and PW4 are positioned such that the partition walls PW1, PW2 and PW4 divide areas where the concave portions CNC1, CNC2 and CNC4 are formed, into a plurality of areas. For example, the first partition wall PW1 may divide the first concave portion CNC1 into two areas, the second partition wall PW2 may divide the second concave portion CNC2 into four areas, and the fourth partition wall PW4 may divide the fourth concave portion CNC4 into two areas.

Lens portions LEN1, LEN2, LEN3 and LEN4 may be positioned in correspondence to the concave portions CNC1, CNC2, CNC3 and CNC4. A first lens portion LEN1, a second lens portion LEN2 and a fourth lens portion LEN4 may be positioned in correspondence to the areas of the concave portions CNC1, CNC2 and CNC4 divided by the partition walls PW1, PW2 and PW4. For example, areas P11 and P12 of the first lens portion LEN1 may be positioned in correspondence to the areas of the first concave portion CNC1 divided by the first partition wall PW1. Areas P21, P22, P23 and P24 of the second lens portion LEN2 may be positioned in correspondence to the areas of the second concave portion CNC2 divided by the second partition wall PW2. Areas P41 and P42 of the fourth lens portion LEN4 may be positioned in correspondence to the areas of the fourth concave portion CNC4 divided by the fourth partition wall PW2.

The areas of the lens portions LEN1, LEN2 and LEN4 may be positioned to be spaced apart from each other. For example, the areas P11 and P12 of the first lens portion LEN1 may not be positioned to overlap with each other but be positioned to be spaced apart from each other, the areas P21, P22, P23 and P24 of the second lens portion LEN2 may not be positioned to overlap with each other but be positioned to be spaced apart from each other, and the areas P41 and P42 of the fourth lens portion LEN4 may not be positioned to overlap with each other but be positioned to be spaced apart from each other. The respective areas of the lens portions LEN1, LEN2 and LEN4 may have convex lens shapes which are positioned to be spaced apart from each other.

In order for the display device to display various colors, a substrate may include subpixels which emit light of different colors. For example, the substrate may include the second subpixel SP2 which emits light of a color different from the first subpixel SP1. In more detail, the first subpixel SP1 and the fourth subpixel SP4 may emit green light, the second subpixel SP2 may emit blue light, and the third subpixel SP3 may emit red light.

Figure 7:
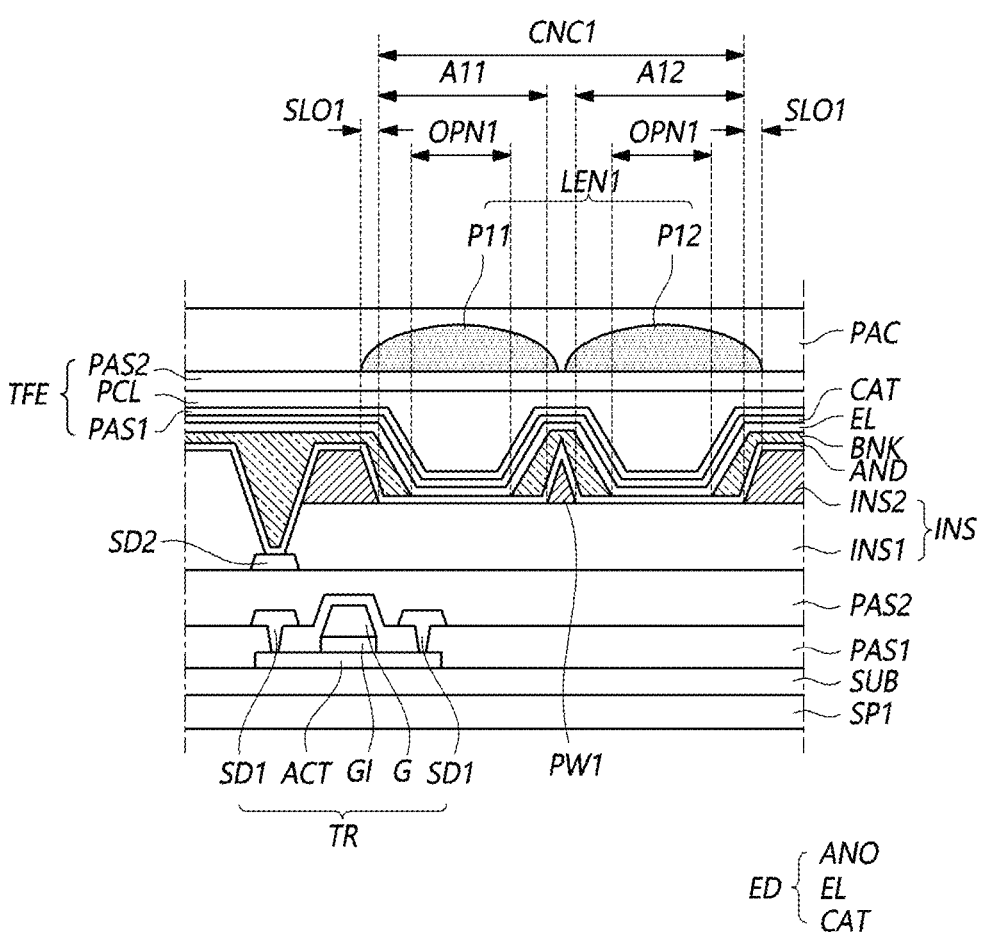
FIGS. 7 and 8 are cross-sectional views of the display device in accordance with the embodiments of the present disclosure.

FIG. 7 is a cross-sectional view of the display device in accordance with the embodiments of the present disclosure. In more detail, FIG. 7 is a cross-sectional view of a partial area including the first subpixel of the display device in accordance with the embodiments illustrated in FIG. 6.

Referring to FIG. 7, the display device in accordance with the embodiments of the present disclosure may include a substrate SUB, an insulating film INS, the first partition wall PW1, a first electrode AND, an encapsulation layer TFE and the first lens portion LEN1.

The substrate SUB may include the first subpixel SP1. The substrate SUB, as a substrate on which, for example, a transistor TR is formed, may be a thin film transistor substrate. The substrate SUB may be a glass substrate or a plastic substrate.

The transistor TR may be positioned on the substrate SUB. The transistor TR may include an active layer ACT, a first source-drain electrode SD1, a gate insulating film GI and a gate electrode G.

The active layer ACT may be positioned on the substrate SUB. The active layer ACT, as a layer which constitutes the channel area of the transistor TR, may include a semiconductor material. The semiconductor material may include, for example, an oxide semiconductor such as IGO (In—Ga—O), IGZO (In—Ga—Zn—O) and ZnO.

The first source-drain electrode SD1 may be a source electrode or a drain electrode of the transistor TR. The first source-drain electrode SD1 may be positioned on a first passivation layer PAS1. The first source-drain electrode SD1 may contact the active layer ACT through a contact hole.

The gate insulating film GI may be positioned between the active layer ACT and the gate electrode G. The first passivation layer PAS1 may be positioned on the active layer ACT, the gate insulating film GI and the gate electrode G. The first passivation layer PAS1, as a layer for protecting a component of a circuit element constituting the first subpixel SP1, such as the transistor TR, may be an organic layer or an inorganic layer.

The transistor TR, as a transistor which constitutes the first subpixel SP1, may be, for example, a driving transistor or a scan transistor. Although FIG. 7 illustrates the transistor TR of a top gate type as an example, the transistor of the display device in accordance with the embodiments of the present disclosure is not limited to a top gate type transistor.

A second passivation layer PAS2 may be positioned on the first passivation layer PAS1 and the first source-drain electrode SD1. The second passivation layer PAS2 may be an organic layer or an inorganic layer.

A second source-drain electrode SD2 may be positioned on the second passivation layer PAS2. The second source-drain electrode SD2 may be electrically connected to the first source-drain electrode SD1.

The insulating film INS may be positioned over the substrate SUB. The insulating film INS may include the first concave portion CNC1 and the first sloped portion SLO1.

The first concave portion CNC1 may be positioned in the first subpixel SP1. The first sloped portion SLO1 may be positioned while surrounding the first concave portion CNC1. The first concave portion CNC1, as a portion which is recessed to be close to the substrate SUB in the insulating film INS, may refer to a portion in which a light emitting element ED is positioned. The first concave portion CNC1 may refer to a portion which is positioned closer to the substrate SUB, among portions of the insulating film INS which are parallel to the substrate SUB.

The insulating film INS may be a single layer or a multilayer. The insulating film INS may be, for example, a multilayer structure which includes a first insulating film INS1 and a second insulating film INS2.

When the insulating film INS is a multilayer structure which includes the first insulating film INS1 and the second insulating film INS2, the first insulating film INS1 may be positioned over the substrate SUB, and the second insulating film INS2 may be positioned on the insulating film INS1. The first concave portion CNC1 may be defined by the second insulating film INS2 which is positioned on the first insulating film INS1 and has a sloped surface while having a taper shape.

The first sloped portion SLO1, as a portion which is positioned while surrounding the first concave portion CNC1, may refer to a portion which connects the first concave portion CNC1 to another portion of the insulating film INS. The first sloped portion SLO1 may refer to a portion of the insulating film INS which connects a portion of the insulating film INS positioned farther from the substrate SUB among the portions of the insulating film INS parallel to the substrate SUB, to the first concave portion CNC1. In the example of FIG. 7, the first sloped portion SLO1 may refer to the sloped surface of the second insulating film INS2 which surrounds a portion of the first insulating film INS1 constituting the first concave portion CNC1.

The first partition wall PW1 may be positioned in the first concave portion CNC1. The fact that the first partition wall PW1 is positioned in the first concave portion CNC1 may mean that an area where the first partition wall PW1 is positioned overlaps with an area where the first concave portion CNC1 is positioned. For example, on a plane parallel to the viewing surface of the display device, the area where the first partition wall PW1 is positioned may be positioned in the area where the first concave portion CNC1 is positioned. Referring to FIG. 6, the first partition wall PW1 may be positioned in the first concave portion CNC1.

Referring to FIG. 7, the first partition wall PW1 may divide the first concave portion CNC1. The fact that the first partition wall PW1 divides the first concave portion CNC1 may mean that the first partition wall PW1 is positioned to substantially divide the first concave portion CNC1. Referring to FIG. 6, the first concave portion CNC1 may be divided into two areas by the first partition wall PW1, and the second concave portion CNC2 may be divided into four areas by the second partition wall PW2.

Referring to FIG. 7, the first concave portion CNC1 may include a first area A11 and a second area A12 which are divided by the first partition wall PW1. The first area A11, as a portion of the first concave portion CNC1, may be referred to as a first area of the first concave portion CNC1. The second area A12, as a portion of the first concave portion CNC1, may be referred to as a second area of the first concave portion CNC1.

When the first partition wall PW1 divides the first concave portion CNC1, the shapes of the openings of subpixels should be considered. Since the first lens portion LEN1 has most excellent light extraction efficiency when the first lens portion LEN1 is circular on a plane, the display device may have excellent light extraction efficiency when areas of the first concave portion CNC1 divided by the first partition wall PW1 have shapes which are substantially point-symmetrical. For example, referring to FIG. 6, areas of the first concave portion CNC1 divided by the first partition wall PW1 may be a square shape. The first area A11 of the first concave portion CNC1 and the second area A12 of the first concave portion CNC1 may have substantially the same area. That is to say, the first partition wall PW1 may divide the first concave portion CNC1 into a plurality of areas which have substantially the same area. When the areas of the first area A11 and the second area A12 are substantially the same, the portions P11 and P12 of the first lens portion LEN1 which are positioned in correspondence to the first area A11 and the second area A12 may have curvatures necessary for light extraction in all areas.

Referring to FIG. 7, the first partition wall PW1 may be made of the same material as the insulating film INS. For example, the first partition wall PW1 may be made of the same material as the first insulating film INS1 or the second insulating film INS2. When the first partition wall PW1 is made of the same material as the insulating film INS, the first partition wall PW1 may be formed together in a process of forming the insulating film INS, and thus, the first partition wall PW1 may be formed without an additional process.

The first partition wall PW1 may have a sloped surface. The sloped surface of the first partition wall PW1 may refer to a portion of the first partition wall PW1 which is not parallel to the substrate SUB and has a predetermined angle with respect to the substrate SUB.

When the first partition wall PW1 has a sloped surface, the first electrode AND which is a reflective electrode may be positioned on the first partition wall PW1. When the first electrode AND which is a reflective electrode is positioned on the sloped surface of the first partition wall PW1, light emitted by the light emitting element ED may be reflected by the first electrode AND which is positioned on the sloped surface of the first partition wall PW1, and thus, the display device may have excellent light extraction efficiency.

The sloped surface of the first partition wall PW1 may refer to a shape which, as described above, allows the first electrode AND positioned on the sloped surface of the first partition wall PW1 to reflect light emitted from the light emitting element ED.

The first electrode AND may be positioned on the insulating film INS and the first partition wall PW1. The first electrode AND, as an electrode which constitutes the light emitting element ED, may be, for example, an anode electrode or a cathode electrode. The first electrode AND may be, for example, a pixel electrode.

The first electrode AND may contact the second source-drain electrode SD2 through a contact hole.

The first electrode AND may be a reflective electrode. The first electrode AND may be a single layer or a multilayer. When the first electrode AND is a multilayer, for example, the first electrode AND may include at least one conductive layer and at least one reflective material layer.

The first electrode AND may be positioned on the first sloped portion SLO1. When the first electrode AND which is a reflective electrode is positioned on the first sloped portion SLO1, since light emitted from the light emitting element ED may be more effectively reflected, the display device may have excellent light extraction efficiency.

The bank BNK may be positioned on the first electrode AND. The bank BNK may include a first opening OPN1 which defines the emission area of the first subpixel SP1.

The bank BNK may be positioned to overlap with the first partition wall PW1. The fact that the bank BNK is positioned to overlap with the first partition wall PW1 may mean that the bank BNK is positioned over the first partition wall PW1. A light emitting layer EL which is positioned on the sloped surface of the first partition wall PW1 may be formed by deposition. When the light emitting layer EL is formed on the sloped surface of the first partition wall PW1 through a deposition process, the light emitting layer EL may be formed thin due to the nature of the deposition process. When the light emitting layer EL is formed thin, a short of the first electrode AND and a second electrode CAT may occur in a portion of the light emitting layer EL which is formed thin. In order to prevent this phenomenon, the bank BNK may be positioned to overlap with the first partition wall PW1.

The light emitting layer EL may be positioned on the bank BNK and the first electrode AND. The light emitting layer EL, as a layer which is positioned between the first electrode AND and the second electrode CAT, may be a layer where light is emitted as holes and electrons having arrived from the first electrode AND and the second electrode CAT are coupled. The light emitting layer EL may be a multilayer, and may be an inorganic layer or an organic layer. For example, the light emitting layer EL may be an organic light emitting layer and the light emitting element ED may be an organic light emitting element. However, the light emitting element of the display device in accordance with the embodiments of the present disclosure is not limited to an organic light emitting element.

The second electrode CAT may be positioned on the light emitting layer EL. The second electrode CAT, as an electrode which constitutes the light emitting element ED, may be a cathode electrode or an anode electrode. The second electrode CAT may be, for example, a common electrode.

The encapsulation layer TFE may be positioned on the first electrode AND. The encapsulation layer TFE, as a layer for protecting the circuit elements of the first subpixel SP1 such as the light emitting element ED and so forth, may be positioned on the light emitting element ED. For example, the encapsulation layer TFE may be positioned on the second electrode CAT.

The encapsulation layer TFE may be a single layer or a multilayer. For example, the encapsulation layer TFE may include a first encapsulation layer PAS1, a second encapsulation layer PCL and a third encapsulation layer PAS2. The encapsulation layer TFE may be an organic layer or an inorganic layer. For example, each of the first encapsulation layer PAS1, the second encapsulation layer PCL and the third encapsulation layer PAS2 may be an organic layer or an inorganic layer.

The first lens portion LEN1 may be positioned on the encapsulation layer TFE. The first lens portion LEN1 may be positioned in correspondence to the areas of the first concave portion CNC1 which are divided by the first partition wall PW1. The fact that the first lens portion LEN1 is positioned in correspondence to the areas of the first concave portion CNC1 which are divided by the first partition wall PW1 may mean that the first lens portion LEN1 includes a plurality of portions corresponding to the areas divided by the first partition wall PW1. As the first lens portion LEN1 is positioned in correspondence to the areas of the first concave portion CNC1 divided by the first partition wall PW1, the first lens portion LEN1 may more effectively extract, to the outside, light of the light emitting element ED extracted to the front by the first partition wall PW1 and the first sloped portion SLO1, and thus, the display device may have excellent light extraction efficiency.

For example, the first lens portion LEN1 may include the first portion P11 and the second portion P12. The first portion P11 may correspond to the first area A11, and the second portion P12 may correspond to the second area A12.

The first lens portion LEN1 may be positioned so as not to overlap with a portion of an area where the first partition wall PW1 is positioned. For example, the first portion P11 and the second portion P12 of the first lens portion LEN1 may be positioned to be spaced apart from each other. As the first portion P11 and the second portion P12 are positioned to be spaced apart from each other over the first partition wall PW1, the first lens portion LEN1 may be positioned so as not to overlap with the portion of the area where the first partition wall PW1 is positioned. As the first lens portion LEN1 is positioned so as not to overlap with the portion of the first partition wall PW1, the first portion P11 and the second portion P12 of the first lens portion LEN1 may have higher aspect ratios. Accordingly, the first lens portion LEN1 may extract light more effectively.

A touch sensor on encapsulation (TOE) structure may be positioned on the encapsulation layer TFE. For example, the TOE structure may include a touch bridge electrode which is positioned on the third encapsulation layer PAS2, a touch buffer layer which is positioned on the touch bridge electrode, and a touch electrode which is positioned on the touch buffer layer. The touch bridge electrode and the touch electrode may be positioned so as not to overlap with the opening OPN1. When the display device includes the TOE structure, the first lens portion LEN1 may be positioned on the touch buffer layer.

The planarization layer PAC may be positioned on the first lens portion LEN1. The planarization layer PAC may be, for example, an optical adhesive layer. The planarization layer PAC may have a lower refractive index than the first lens portion LEN1.

Figure 8:
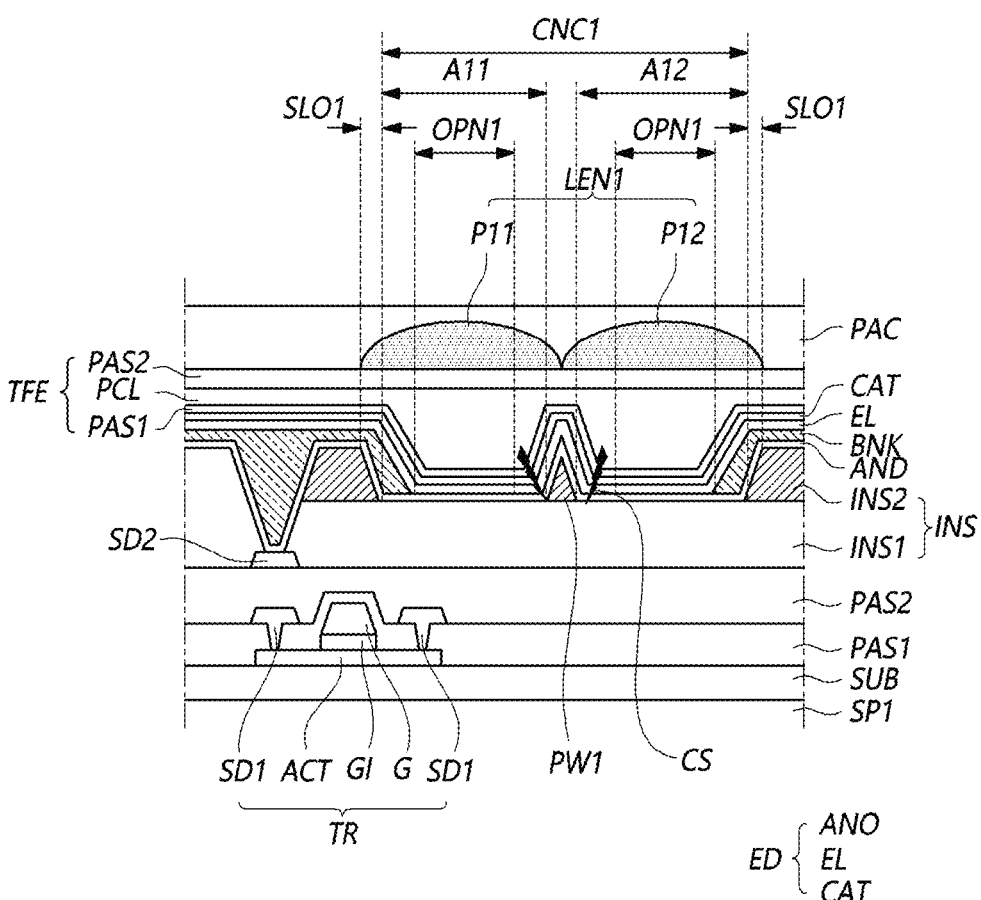

FIG. 8 is a cross-sectional view of the display device in accordance with the embodiments of the present disclosure. In more detail, FIG. 8 is a cross-sectional view of a partial area including the first subpixel of the display device in accordance with the embodiments illustrated in FIG. 6.

Among the details of the display device in accordance with the embodiments of the present disclosure illustrated in FIG. 8, details which are not particularly described otherwise may be the same as those described above for the display device in accordance with the embodiments of the present disclosure illustrated in FIG. 7.

Referring to FIG. 8, the first lens portion LEN1 may be positioned to overlap with the entirety of the area where the first partition wall PW1 is positioned. In other words, the area where the first lens portion LEN1 is positioned may overlap with the entirety of the area where the first partition wall PW1 is positioned. An area where the first portion P11 of the first lens portion LEN1 is positioned and an area where the second portion P12 of the first lens portion LEN1 is positioned may overlap with the entirety of the area where the first partition wall PW1 is positioned. When, in this way, the first lens portion LEN1 is positioned to overlap with the entirety of the area where the first partition wall PW1 is positioned, the first lens portion LEN1 may extract light more effectively.

The bank BNK may be positioned so as not to overlap with the first partition wall PW1. Namely, the bank BNK may not be positioned on the first partition wall PW1. Unlike the display device in accordance with the embodiments illustrated in FIG. 7, in the display device in accordance with the embodiments illustrated in FIG. 8, the bank BNK may not be positioned on the first partition wall PW1. As the bank BNK is not positioned on the first partition wall PW1, the area of the opening OPN1 may be wider than the area of the opening OPN1 of the display device in accordance with embodiments illustrated in FIG. 7.

However, when the bank BNK is not positioned on the first partition wall PW1, the thickness of the light emitting layer EL which is positioned on the first partition wall PW1 may be much thinner than the thickness of the light emitting layer EL which is positioned elsewhere. This may be caused due to the fact that, when the light emitting layer EL is formed by deposition, the light emitting layer EL is formed thin on a sloped surface due to the nature of the deposition process.

When the light emitting layer EL is formed thin on the first partition wall PW1, a short may occur between the first electrode AND and the second electrode CAT. In order to solve this, the second electrode CAT may include a structure CS in which the second electrode CAT is cut along the first partition wall PW1. Such a cut structure of the second electrode CAT may be caused by the fact that the first partition wall PW1 has a sufficiently steep sloped surface. In more detail, when the first partition wall PW1 has a sufficiently steep sloped surface, the second electrode CAT which is formed on the first partition wall PW1 may have a structure in which the second electrode CAT is cut along the first partition wall PW1. For example, when the first partition wall PW1 has a steep sloped surface having an angle of 70° or more, the second electrode CAT may have the structure CS in which the second electrode CAT is cut along the first partition wall PW1. The angle of the sloped surface of the first partition wall PW1 may refer to an angle that the sloped surface of the first partition wall PW1 has with respect to a surface parallel to the substrate SUB.

Figure 9:
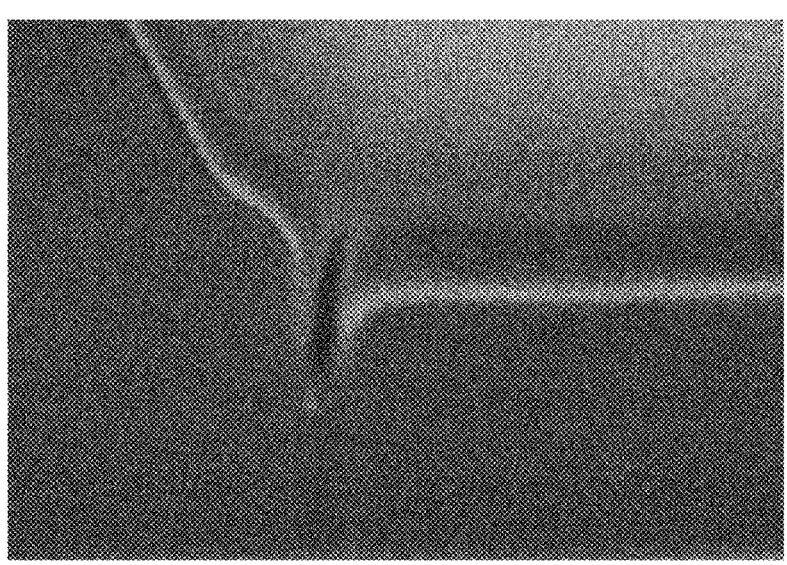
FIG. 9 is a photograph showing the cross-section of the display device in accordance with the embodiments of the present disclosure.

FIG. 9 is a photograph showing the cross-section of the display device in accordance with the embodiments of the present disclosure. In more detail, FIG. 9 is a photomicrograph of a partial cross-sectional area of the display device in accordance with the embodiments illustrated in FIG. 8.

FIG. 9 is a photograph showing the structure CS in which the second electrode CAT is cut along the first partition wall PW1 in FIG. 8. Referring to FIG. 9, it may be seen that a short occurs in the second electrode CAT due to the sloped surface of the first partition wall PW1 at a point where the sloped surface of the first partition wall PW1 starts.

Referring to FIGS. 8 and 9, in the display device in accordance with the embodiments of FIG. 8, as the bank BNK is positioned so as not to overlap with the first partition wall PW1, the first subpixel SP1 may have the opening OPN1 of a wider area. Even though the bank BNK is not positioned on the first partition wall PW1, since the second electrode CAT has the structure CS in which the second electrode CAT is cut along the first partition wall PW1, it is possible to prevent a risk for the first electrode AND and the second electrode CAT to be shorted on the first partition wall PW1.

Figure 10:
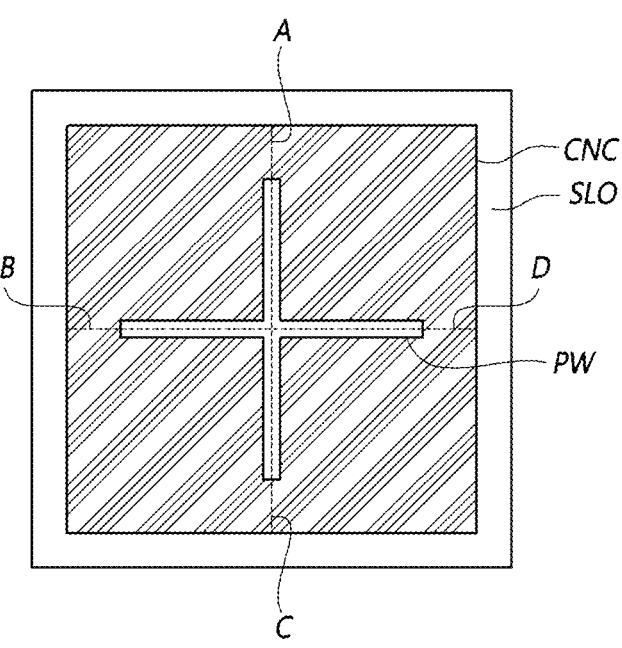
FIGS. 10 to 13 are plan views of display devices in accordance with embodiments of the present disclosure.

FIG. 10 is a plan view of a display device in accordance with embodiments of the present disclosure. In more detail, FIG. 10 is a plan view illustrating a concave portion, a sloped portion and a partition wall which divides the concave portion in the display device in accordance with the embodiments of the present disclosure.

Referring to FIG. 10, the display device in accordance with the embodiments of the present disclosure may include a concave portion CNC, a sloped portion SLO which is positioned while surrounding the concave portion CNC, and a partition wall PW which is positioned in the concave portion CNC and divides the concave portion CNC.

The partition wall PW may divide the concave portion CNC. In the embodiments described above with reference to FIGS. 8 and 9, it has been described that a second electrode has a structure in which the second electrode is cut along the partition wall PW. In the case where the second electrode is a common electrode, a problem may arise in that, when the second electrode is completely divided by the partition wall PW, a light emitting element is not turned on in an area where the second electrode is completely divided.

In order to solve this problem, in the embodiments illustrated in FIGS. 8 and 9 in which a bank is not positioned on a partition wall, the partition wall PW may not completely divide the concave portion CNC but substantially divide the concave portion CNC. The fact that the partition wall PW substantially divides the concave portion CNC may mean that the partition wall PW divides most areas of the concave portion CNC to the extent that it is possible to prevent a partial area of a subpixel from being not turned on as a second electrode is completely divided.

As illustrated in FIG. 10, when the partition wall PW is positioned, the partition wall PW may not be positioned at edges A, B, C and D of the concave portion CNC. The connection of the second electrode may be maintained through the edges A, B, C and D of the concave portion CNC where the partition wall PW is not positioned. Such a structural feature of the partition wall PW for maintaining the connection of the second electrode may be referred to as a second electrode connection structure.

Figure 11:
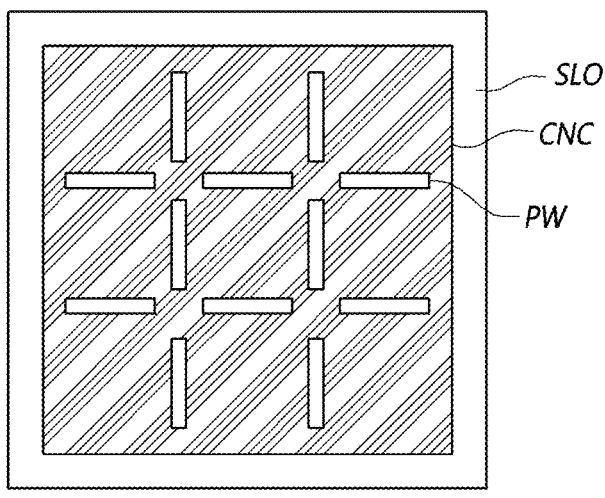

FIG. 11 is a plan view illustrating a concave portion, a sloped portion and a partition wall which divides the concave portion, in a display device in accordance with other embodiments of the present disclosure.

Referring to FIG. 11, the display device may have a second electrode connection structure even at an intersection of the partition wall PW so that an area where a second electrode is completely divided by a partition wall PW is not formed. That is to say, referring to FIGS. 10 and 11, the second electrode connection structure may be positioned at the edges of the partition wall PW and the intersection of the partition wall PW.

Figure 12:
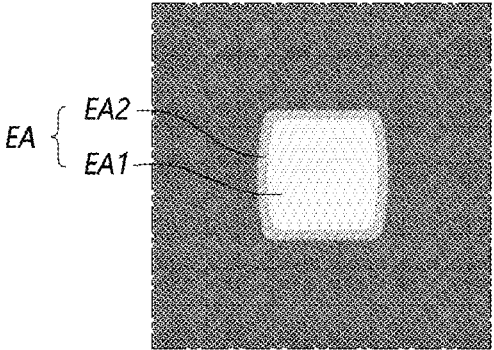

FIG. 12 is a plan view of the display device in accordance with the embodiments of the present disclosure. In more detail, FIG. 12 is a plan view of a partial area of an area including the first subpixel SP1 in the active area of the display device in accordance with the embodiments illustrated in FIGS. 7 and 8. FIG. 12 shows an emission area observed when a light emitting element included in a first subpixel emits light.

Referring to FIG. 12, the first subpixel may include an emission area EA. The emission area EA may refer to an area where light is emitted from the first subpixel. The emission area EA may include a first area EA1 and a second area EA2. The first area EA1 may also be referred to as a first emission area. The second area EA2 may also be referred to as a second emission area.

The first area EA1 may correspond to the above-described first concave portion CNC1. The fact that the first area EA1 corresponds to the first concave portion CNC1 may mean that an area where the first area EA1 is positioned is substantially the same as an area where the first concave portion CNC1 is positioned. The second area EA2 may correspond to the above-described first sloped portion SLO1. The fact that the second area EA2 corresponds to the first sloped portion SLO1 may mean that an area where the second area EA2 is positioned is substantially the same as an area where the first sloped portion SLO1 is positioned.

The first area EA1 and the second area EA2 may emit light of different wavelengths. Referring to FIGS. 12, 7 and 8, the first area EA1 may be an area where light emitted from the light emitting element ED is directly emitted to the outside of the display device without being reflected from the first electrode AND positioned on the first sloped portion SLO1. The second area EA2 may be an area where light emitted from the light emitting element ED is emitted to the outside by being reflected from the first electrode AND positioned on the first sloped portion SLO1. Accordingly, since light paths of the first area EA1 and the second area EA2 are different, the first area EA1 and the second area EA2 may emit light of different wavelengths.

The details of the first subpixel SP1 described above with reference to FIGS. 7 to 12 may be applied the same to the second subpixel SP2, the third subpixel SP3 and the fourth subpixel SP4 unless specifically described otherwise. The first subpixel SP1 and the fourth subpixel SP4 may be substantially the same. The second subpixel SP2 may be the same as the first subpixel SP1 except that the concave portion CNC2, the partition wall PW2 and the lens portion LEN2 are different in shapes from the concave portion CNC1, the partition wall PW1 and the lens portion LEN1 of the first subpixel SP1. The third subpixel SP3 may be the same as the first subpixel SP1 except that, since the third subpixel SP3 does not include a partition wall, the concave portion CNC3 is not divided into a plurality of areas and the lens portion LEN3 does not include portions.

For example, when referring to FIGS. 6 to 8 with respect to the second subpixel SP2, the insulating film INS may include the second concave portion CNC2 which is positioned in the second subpixel SP2 and the second sloped portion SLO2 which surrounds the second concave portion CNC2. The second partition wall PW2 may be positioned in the second concave portion CNC2, and may divide the second concave portion CNC2. The first electrode AND may be positioned on the insulating film INS and the second partition wall PW2. The second lens portion LEN2 may be positioned on the encapsulation layer TFE, and may be positioned in correspondence to the areas of the second concave portion CNC2 which are divided by the second partition wall PW2.

Referring to FIG. 6, the areas of the first concave portion CNC1 which are divided by the first partition wall PW1 and the areas of the second concave portion CNC2 which are divided by the second partition wall PW2 may have substantially the same area. The areas of the fourth concave portion CNC4 which are divided by the fourth partition wall PW4 may have substantially the same area as the areas of the first concave portion CNC1 which are divided by the first partition wall PW1 and the areas of the second concave portion CNC2 which are divided by the second partition wall PW2. The areas of the first concave portion CNC1 which are divided by the first partition wall PW1, the areas of the second concave portion CNC2 which are divided by the second partition wall PW2 and the areas of the fourth concave portion CNC4 which are divided by the fourth partition wall PW4 may have substantially the same area as the third concave portion CNC3. In other words, the area of the areas of the concave portions CNC1, CNC2 and CNC4 which are divided by the partition walls PW1, PW2 and PW4 may be substantially the same as the area of the concave portion CNC3 which has a smallest area. The lens portions LEN1, LEN2, LEN3 and LEN4 may be formed by the same photolithography process. When the lens portions LEN1, LEN2, LEN3 and LEN4 are formed by the same photolithography process, the first lens portion LEN1, the second lens portion LEN2, the third lens portion LEN3 and the fourth lens portion LEN4 may have the same height. When the partition walls PW1, PW2 and PW4 divide the concave portions CNC1, CNC2 and CNC4 as described above, the lens portions LEN1, LEN2, LEN3 and LEN4 which have the same height may have substantially the same aspect ratio. The fact that the lens portions LEN1, LEN2, LEN3 and LEN4 have the same aspect ratio may mean that respective portions which constitute the lens portions LEN1, LEN2, LEN3 and LEN4 have the same aspect ratio.

Figure 13:
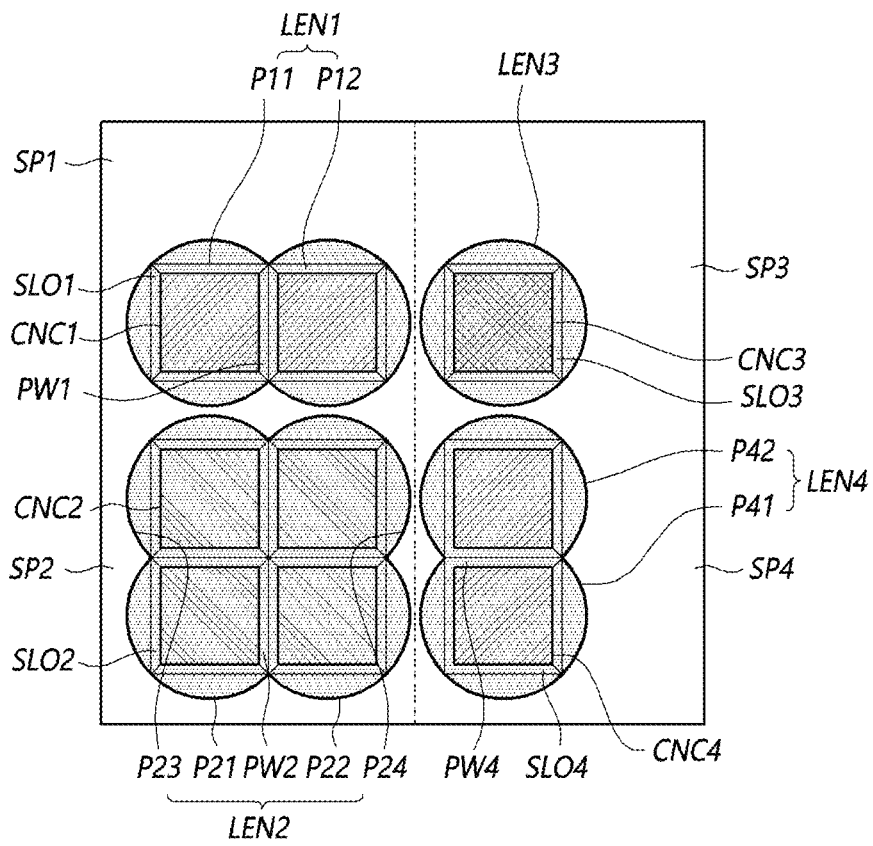

FIG. 13 is a plan view of a display device in accordance with embodiments of the present disclosure. In more detail, FIG. 13 is a plan view of a part of an active area in the display device in accordance with the embodiments of the present disclosure.

Details of the display device illustrated in FIG. 13 may be the same as those described for the display device illustrated in FIG. 6 unless specifically described otherwise.

Referring to FIG. 13, the lens portions LEN1, LEN2, LEN3 and LEN4 may be positioned to overlap with entire areas where the concave portions CNC1, CNC2, CNC3 and CNC4 are positioned. In addition, the lens portions LEN1, LEN2, LEN3 and LEN4 may be positioned to overlap with entire areas where the sloped portions SLO1, SLO2, SLO3 and SLO4 are positioned. When the lens portions LEN1, LEN2, LEN3 and LEN4 are positioned to overlap with the entire areas where the concave portions CNC1, CNC2, CNC3 and CNC4 and the sloped portions SLO1, SLO2, SLO3 and SLO4 are positioned, the lens portions LEN1, LEN2, LEN3 and LEN4 may more effectively extract light emitted from the display device, and thus, the display device may have high light emitting efficiency.

The portions P11, P12, P21, P22, P23, P24, P41 and P42 of the lens portions LEN1, LEN2 and LEN4 may be positioned to overlap with each other. In more detail, the first portion P11 and the second portion P12 of the first lens portion LEN1 may be positioned to overlap with each other. For example, the first portion P11 and the second portion P12 may have circular shapes which overlap with each other. The first portion P21, the second portion P22, the third portion P23 and the fourth portion P24 of the second lens portion LEN2 may be positioned to overlap with each other. For example, the first portion P21, the second portion P22, the third portion P23 and the fourth portion P24 of the second lens portion LEN2 may have circular shapes which overlap with each other. The first portion P41 and the second portion P42 of the fourth lens portion LEN4 may be positioned to overlap with each other. For example, the first portion P41 and the second portion P42 of the fourth lens portion LEN4 may have circular shapes which overlap with each other.

Figure 14:
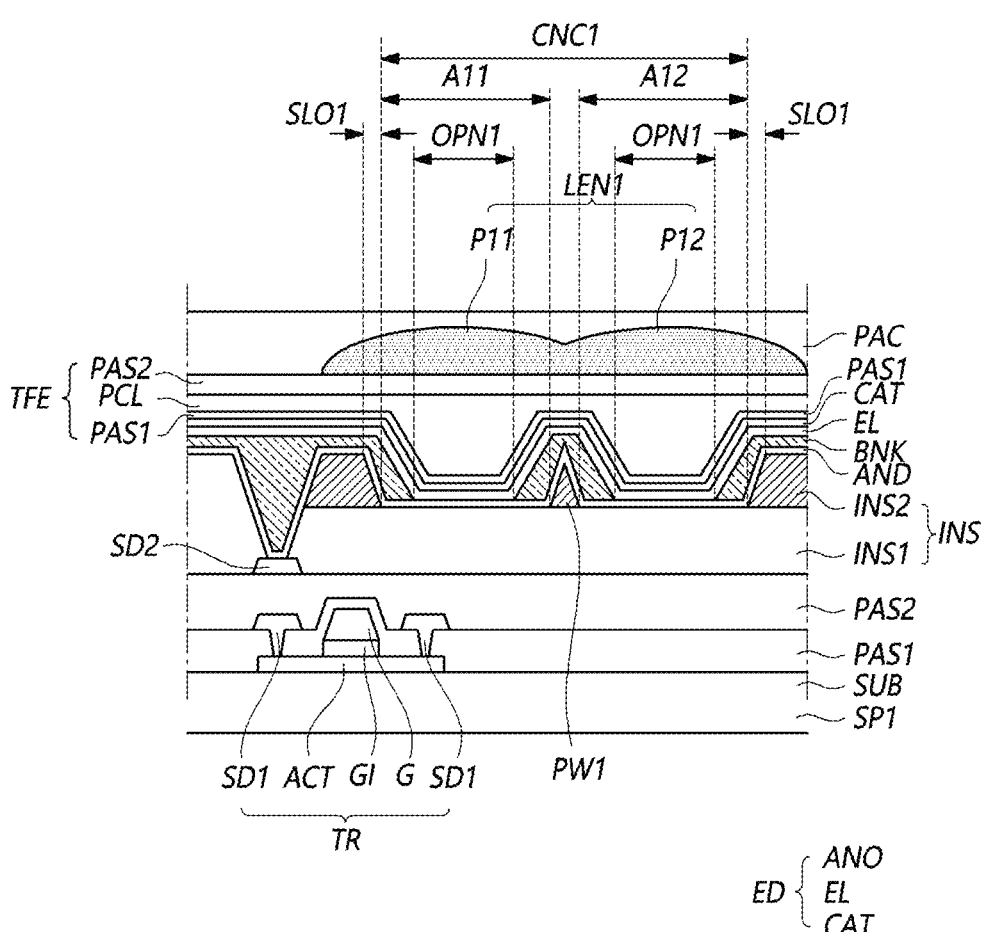
FIGS. 14 and 15 are cross-sectional views of the display device in accordance with the embodiments of the present disclosure.

FIG. 14 is a cross-sectional view of the display device in accordance with the embodiments of the present disclosure. In more detail, FIG. 14 is a cross-sectional view of a partial area including the first subpixel of the display device in accordance with the embodiments illustrated in FIG. 13.

Details of the display device illustrated in FIG. 14 are the same as those described for the display device illustrated in FIG. 7 unless specifically described otherwise.

Referring to FIG. 14, the first lens portion LEN1 may include the first portion P11 and the second portion P12. The first portion P11 and the second portion P12 may be positioned to overlap with each other. An area where the first portion P11 and the second portion P12 overlap may overlap with an area where the first partition wall PW1 is positioned. When the plurality of portions P11 and P12 included in the first lens portion LEN1 are positioned to overlap with each other, the first lens portion LEN1 may more effectively extract light emitted from the light emitting element ED.

Figure 15:
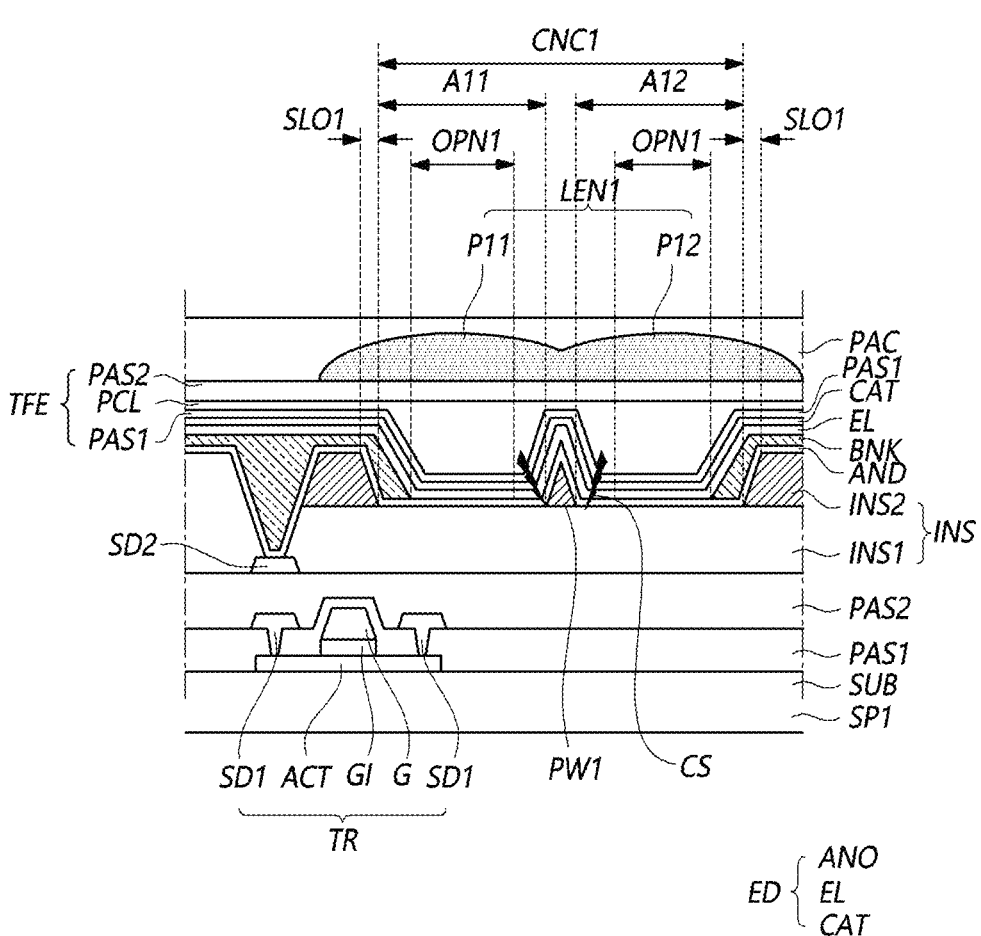

FIG. 15 is a cross-sectional view of the display device in accordance with the embodiments of the present disclosure. In more detail, FIG. 15 is a cross-sectional view of a partial area including the first subpixel of the display device in accordance with the embodiments illustrated in FIG. 13.

Details of the display device illustrated in FIG. 15 are the same as those described for the display device illustrated in FIG. 8 unless specifically described otherwise.

Referring to FIG. 15, the first lens portion LEN1 may include the first portion P11 and the second portion P12. The first portion P11 and the second portion P12 may be positioned to overlap with each other. An area where the first portion P11 and the second portion P12 overlap may overlap with an area where the first partition wall PW1 is positioned. When the plurality of portions P11 and P12 included in the first lens portion LEN1 are positioned to overlap with each other, the first lens portion LEN1 may more effectively extract light emitted from the light emitting element ED.

Figure 16:
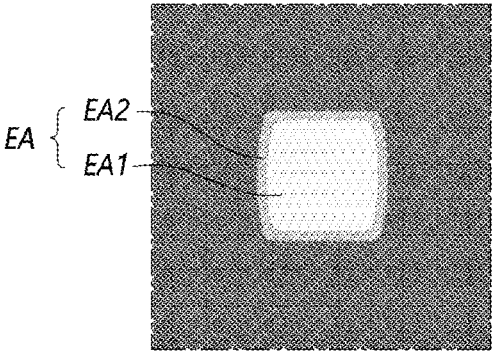
FIG. 16 is a plan view of the display device in accordance with the embodiments of the present disclosure.

FIG. 16 is a plan view of the display device in accordance with the embodiments of the present disclosure. In more detail, FIG. 16 is a plan view of a partial area of an area including the first subpixel SP1 in the active area of the display device in accordance with the embodiments illustrated in FIGS. 14 and 15. FIG. 16 shows an emission area observed when a light emitting element included in a first subpixel emits light.

Referring to FIG. 16, the first subpixel may include an emission area EA. The emission area EA may refer to an area where light is emitted from the first subpixel. The emission area EA may include a first area EA1 and a second area EA2. The first area EA1 may also be referred to as a first emission area. The second area EA2 may also be referred to as a second emission area.

The first area EA1 may correspond to the above-described first concave portion CNC1. The fact that the first area EA1 corresponds to the first concave portion CNC1 may mean that an area where the first area EA1 is positioned is substantially the same as an area where the first concave portion CNC1 is positioned. The second area EA2 may correspond to the above-described first sloped portion SLO1. The fact that the second area EA2 corresponds to the first sloped portion SLO1 may mean that an area where the second area EA2 is positioned is substantially the same as an area where the first sloped portion SLO1 is positioned.

The first area EA1 and the second area EA2 may emit light of different wavelengths. Referring to FIGS. 16, 14 and 15, the first area EA1 may be an area where light emitted from the light emitting element ED is directly emitted to the outside of the display device without being reflected from the first electrode AND positioned on the first sloped portion SLO1. The second area EA2 may be an area where light emitted from the light emitting element ED is emitted to the outside by being reflected from the first electrode AND positioned on the first sloped portion SLO1. Accordingly, since light paths of the first area EA1 and the second area EA2 are different, the first area EA1 and the second area EA2 may emit light of different wavelengths.

A brief description of the embodiments of the present disclosure described above is as follows.

A display device 100 may include a substrate SUB, an insulating film INS, a first partition wall PW1, a first electrode AND, an encapsulation layer TFE and a first lens portion LEN1.

The substrate SUB may include a first subpixel SP1.

The insulating film INS may include a first concave portion CNC1 and a first sloped portion SLO1. The first concave portion CNC1 may be positioned in the first subpixel SP1. The first sloped portion SLO1 may be positioned while surrounding the first concave portion CNC1.

The first partition wall PW1 may be positioned in the first concave portion CNC1. The first partition wall PW1 may divide the first concave portion CNC1.

The first electrode AND may be positioned on the insulating film INS and the first partition wall PW1.

The encapsulation layer TFE may be positioned on the first electrode AND.

The first lens portion LEN1 may be positioned on the encapsulation layer TFE. The first lens portion LEN1 may be positioned in correspondence to areas of the first concave portion CNC1 which are divided by the first partition wall PW1.

The first concave portion CNC1 may include a first area A11 and a second area A12 which are divided by the first partition wall PW1.

The first lens portion LEN1 may include a first portion P11 which corresponds to the first area A11 and a second portion P12 which corresponds to the second area A12.

The first lens portion LEN1 may be positioned not to overlap with a portion of an area where the first partition wall PW1 is positioned.

The first lens portion LEN1 may be positioned to overlap with entirety of an area where the first partition wall PW1 is positioned.

The display device 100 may include a bank BNK which is positioned on the first electrode AND.

The bank BNK may be positioned to overlap with the first partition wall PW1.

The bank BNK may be positioned not to overlap with the first partition wall PW1.

The display device 100 may include a light emitting layer EL and a second electrode CAT. The light emitting layer EL may be positioned on the bank BNK and the first electrode AND. The second electrode CAT may be positioned on the light emitting layer EL.

The second electrode CAT may include a structure CS in which the second electrode CAT is cut along the first partition wall PW1.

The first subpixel SP1 may include an emission area EA. The emission area EA may include a first area EA1 and a second area EA2. The first area EA1 may correspond to the first concave portion CNC1. The second area EA2 may be positioned while surrounding the first area EA1.

The first area EA1 and the second area EA2 may emit light of different wavelengths.

The first area A11 of the first concave portion CNC1 and the second area A12 of the first concave portion CNC1 may have substantially the same area.

The substrate SUB may include a second subpixel SP2 which emits light of a color different from the first subpixel SP1.

The insulating film INS may include a second concave portion CNC2 which is positioned in the second subpixel SP2 and a second sloped portion SLO2 which is positioned while surrounding the second concave portion CNC2.

The display device 100 may include a second partition wall PW2 which is positioned in the second concave portion CNC2 and divides the second concave portion CNC2.

The first electrode AND may be positioned on the insulating film INS and the second partition wall PW2.

The display device 100 may include a second lens portion LEN2. The second lens portion LEN2 may be positioned on the encapsulation layer TFE. The second lens portion LEN2 may be positioned in correspondence to areas of the second concave portion CNC2 which are divided by the second partition wall PW2.

The areas A11 and A12 of the first concave portion CNC1 which are divided by the first partition wall PW1 and the areas of the second concave portion CNC2 which are divided by the second partition wall PW2 may have substantially the same area.

The first lens portion LEN1 and the second lens portion LEN2 may have substantially the same height.

The first lens portion LEN1 and the second lens portion LEN2 may have substantially the same aspect ratio.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate including a first subpixel;
an insulating film including a first concave portion which is positioned in the first subpixel and a first sloped portion which is positioned while surrounding the first concave portion, and positioned on the substrate;

a first partition wall positioned in the first concave portion, and dividing the first concave portion;

a first electrode positioned on the insulating film and the first partition wall;

an encapsulation layer positioned on the first electrode; and a first lens portion positioned on the encapsulation layer, and positioned in correspondence to areas of the first concave portion which are divided by the first partition wall.

2. The display device of claim 1, wherein the first concave portion includes a first area and a second area which are divided by the first partition wall.

3. The display device of claim 1, wherein the first concave portion includes a first area and a second area which are divided by the first partition wall, and the first lens portion includes a first portion which corresponds to the first area and a second portion which corresponds to the second area.

4. The display device of claim 1, wherein the first lens portion is positioned not to overlap with a portion of an area where the first partition wall is positioned.

5. The display device of claim 1, wherein the first lens portion is positioned to overlap with entirety of an area where the first partition wall is positioned.

6. The display device of claim 1, further comprising:

a bank positioned on the first electrode, wherein the bank is positioned to overlap with the first partition wall.

7. The display device of claim 1, further comprising:

a bank positioned on the first electrode, wherein the bank is positioned not to overlap with the first partition wall.

8. The display device of claim 7, further comprising:

a light emitting layer positioned on the bank and the first electrode; and a second electrode positioned on the light emitting layer, wherein the second electrode includes a structure in which the second electrode is cut along the first partition wall.

9. The display device of claim 1, wherein the first subpixel includes an emission area, and the emission area includes a first area which corresponds to the first concave portion and a second area which is positioned while surrounding the first area.

10. The display device of claim 9, wherein the first area and the second area emit light of different wavelengths.

11. The display device of claim 2, wherein the first area of the first concave portion and the second area of the first concave portion have substantially the same area.

12. The display device of claim 1, wherein the substrate includes a second subpixel which emits light of a color different from the first subpixel, the insulating film includes a second concave portion which is positioned in the second subpixel, and a second sloped portion which is positioned while surrounding the second concave portion, the display device includes a second partition wall which is positioned in the second concave portion and divides the second concave portion, the first electrode is positioned on the insulating film and the second partition wall, the display device includes a second lens portion which is positioned on the encapsulation layer and is positioned in correspondence to areas of the second concave portion which are divided by the second partition wall, and the areas of the first concave portion which are divided by the first partition wall and the areas of the second concave portion which are divided by the second partition wall have substantially the same area.

13. The display device of claim 12, wherein the first lens portion and the second lens portion have substantially the same height.

14. The display device of claim 12, wherein the first lens portion and the second lens portion have substantially the same aspect ratio.

* * * * *